United States Patent
Yakushevska et al.

(10) Patent No.: US 7,825,378 B2
(45) Date of Patent: Nov. 2, 2010

(54) METHOD FOR OBTAINING A SCANNING TRANSMISSION IMAGE OF A SAMPLE IN A PARTICLE-OPTICAL APPARATUS

(75) Inventors: Alevtyna Yakushevska, Eindhoven (NL); Erwan Sourty, Eindhoven (NL); Uwe Luecken, Eindhoven (NL); Bert Freitag, Eindhoven (NL)

(73) Assignee: FEI Company, Hillsboro, OR (US)

( * ) Notice: Subject to any disclaimer, the term of this patent is extended or adjusted under 35 U.S.C. 154(b) by 239 days.

(21) Appl. No.: 12/274,962

(22) Filed: Nov. 20, 2008

(65) Prior Publication Data

US 2009/0133167 A1    May 21, 2009

(30) Foreign Application Priority Data

Nov. 21, 2007  (EP) .................... 07121186

(51) Int. Cl.
*H01J 37/256* (2006.01)
*H01J 37/30* (2006.01)
*G21K 5/10* (2006.01)
*G01N 13/10* (2006.01)

(52) U.S. Cl. .............. 250/311; 250/310; 250/306; 250/307; 250/492.2; 250/492.3; 850/3

(58) Field of Classification Search ............ 250/311, 250/310, 306, 307, 492.2, 492.3; 850/3
See application file for complete search history.

(56) References Cited

U.S. PATENT DOCUMENTS 6,946,654 B2 * 9/2005 Gerlach et al. ............. 850/3
6,949,756 B2 * 9/2005 Gerlach et al. ......... 250/492.21
2004/0140438 A1 * 7/2004 Gerlach et al. ......... 250/492.21

OTHER PUBLICATIONS

Bender, H. et al., "3D-Analysis of Semiconductor Structures by Electron Tomography," ScienceDirect, May 26, 2007, pp. 2707-2713, vol. 84, No. 11.
Kubel, C. et al., "Recent Advances in Electron Ttomography: TEM and HAADF-STEM Tomography for Materials Science and Semiconductor Applications," Microscopy and Microanalysis, Oct. 1, 2005, pp. 396-400, vol. 11, No. 5.

(Continued)

*Primary Examiner*—Nikita Wells
(74) *Attorney, Agent, or Firm*—Scheinberg & Griner, LLP; Michael O. Scheinberg; Robert McMinn

(57) ABSTRACT

A method for improving the resolution of STEM images of thick samples. In STEM, the diameter of the cross-over depends on the opening half-angle α of the beam and can be as low as 0.1 nm. For optimum resolution an opening half-angle is chosen at which the diameter of the cross-over R(α) shows a minimum. For thick samples the resolution is, for those parts of the sample removed from the cross-over plane, limited by the convergence of the beam, resulting in a diameter D of the beam at the surface of the sample. The opening angle is chosen to balance the contribution of convergence and of diameter of the cross-over by choosing an opening half-angle smaller than the optimum opening half-angle. Effectively the sample is then scanned with a beam that has a substantially constant diameter over the length of the sample material through which the electrons have to travel.

18 Claims, 4 Drawing Sheets

OTHER PUBLICATIONS

Figure 1:
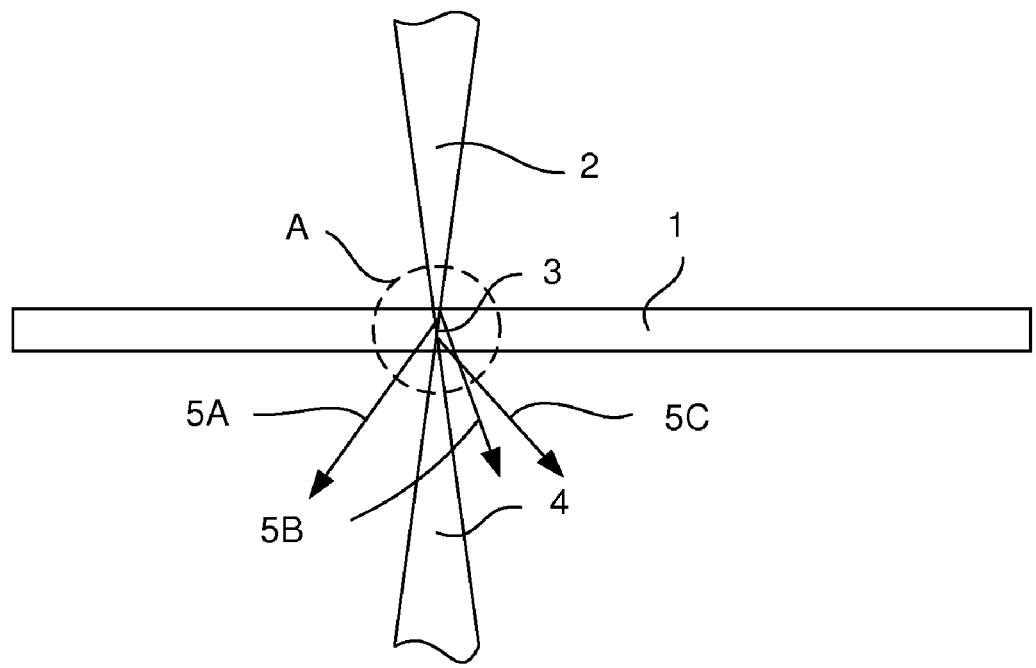

Treacy, M. et al., "Atomic Contrast Transfer in Annular Darkfield Images," Journal of Microscopy, Oct. 1995, vol. 180, pp. 2-11.

Borisevich, A. et al., "Depth Sectioning with The Aberration-Corrected Scanning Transmission Electron Microscope," Proceeding of the National Academy of Sciences of the United States of America, Feb. 28, 2006, pp. 3044-3048, vol. 103, No. 9.

Barth, J.E. et al., "Addition of Different Contributuions to the Charged Particle Probe Size," Optik, pp. 101-109, vol. 101, No. 3.

Reimer, L. et al., "Transmission Electron Microscopy: Physics of Image Formation and Microanalysis," Springer Series in Optical Sciences, May 16, 1997, pp. 100-103, 4th Edition.

* cited by examiner

METHOD FOR OBTAINING A SCANNING TRANSMISSION IMAGE OF A SAMPLE IN A PARTICLE-OPTICAL APPARATUS

The invention relates to a method for obtaining a scanning transmission image of a sample in a particle-optical apparatus, said apparatus equipped to image a sample by scanning the sample with a finely focused beam of particles and detecting particles transmitted through the sample, said finely focused beam showing a smallest diameter, the so-named cross-over, the diameter of the cross-over R being a function of the opening half-angle α of the finely focused beam, the method comprising:

acquiring an image of the sample by scanning the sample with the finely focused beam of particles and detecting particles transmitted through the sample, The invention further relates to software to obtain such images.

Such a method is known from "Recent advances in Electron Tomography: TEM and HAADF-STEM Tomography for materials science and IC applications", C. Kubel et al., Microscopy and Microanalysis, 2005, Vol. 11, number 5, pages 378-400. In this publication a method known as STEM (Scanning Transmission Electron Microscopy) tomography is described.

In STEM a sample is scanned by a finely focused beam of electrons. The electrons have an energy of typically between 80 and 300 keV. Some of the electrons are absorbed by the sample, some are scattered in the sample and some electrons pass through the sample unhindered. The electrons passing through the sample (scattered and unscattered electrons) are detected by an electron detector. In this way it is possible to get a 2D image of the sample.

To study certain features such as catalysts, macro-molecules or structures in biological tissue in samples, it is often desired to make a 3D representation of said features. To obtain such a 3D representation a series of 2D images of the sample at different tilt angles is combined in a 3D tomogram.

For optimum resolution in a STEM extremely thin samples are used. Resolutions of less than 0.1 nm can be obtained for samples thinner than 50 nm. As known to the person skilled in the art a thicker sample, e.g. a sample thicker than 100 nm, can not be imaged with such a high resolution. Especially when the sample is tilted as well, as is being done during STEM tomography, the effective thickness of the sample limits the resolution.

There is a need for a method to improve the resolution of images of thick samples.

To that end the method according to the invention is characterized in that the thickness T of the sample is determined, the length L of the sample material through which the transmitted particles have to travel is derived from the thickness T of the sample, and the opening half-angle is set to a value α such that $0.5 \cdot R(\alpha)/L \leq \tan(\alpha) \leq 2 \cdot R(\alpha)/L$, as a result of which the sample is scanned with a beam having a substantially constant diameter over a length equal to the length L of the sample material through which the transmitted particles have to travel.

As known to the person skilled in the art the diameter of the cross-over depends on the opening half-angle of the beam. This is explained in e.g. "Transmission Electron Microscopy", L. Reimer, Springer Verlag, 4$^{th}$ ed., ISBN 3-540-62568-2. In section 4.2.2 of said handbook, more specifically in formula 4.18 and FIG. 4.13, it is shown that the diameter of the cross-over is a function of the opening half-angle of the beam, that a minimum diameter of the cross-over occurs for a certain opening half-angle, while smaller and larger opening half-angles result in larger cross-over diameters. For best resolution the person skilled in the art will thus select the opening half-angle resulting in the optimum resolution.

It is noted that the minimum beam diameter depends on the accelerating voltage and several parameters of the instrument used. Nowadays commercial instruments are available that achieve a STEM resolution below 0.1 nm using opening angles in excess of 10 mrad, such as the Titan™ 80-300 of FEI Company, Hillsboro, USA. Such a resolution is obtained using very thin samples of e.g. less than 50 nm thick.

The method according to the invention is based on the insight that the beam for an optimum opening half-angle may show an optimum for the diameter of the cross-over, e.g. a diameter of 0.1 nm, but that the diameter of the beam elsewhere in the sample has a much larger diameter due to the opening half-angle used. For a sample with a thickness of e.g. 500 nm, and an opening half-angle of e.g. 10 mrad, the diameter of the beam 250 nm removed from the cross-over is 5 nm. Therefore the resolution in part of the sample is not close to 0.1 nm, but more than 10 times larger.

Reducing the opening half-angle results in a larger diameter of the cross-over, but the beam diameter at a position removed from the cross-over is reduced. By selecting an opening half-angle in which the broadening of the cross-over is balanced with the broadening of the beam inside the sample as a result of the opening angle, an image with optimum overall resolution is obtained.

It is noted that this method resembles the method known as microbeam TEM, where a parallel beam with small diameter (typically several micrometers) is generated to illuminate a part of the sample. This makes it possible to obtain e.g. crystallographic information of micro-crystallites by studying the diffraction pattern of the transmitted electrons. Here the beam diameter is not limited by the beam aberrations as explained in the book of Reimer mentioned before, but is governed by the demand that it is a parallel beam, necessary for diffraction. Also, the microbeam is not scanned over the sample, but instead a selected area is selected by positioning the microbeam on the selected area, after which an image, such as a diffraction image, is made thereof, or an X-ray analysis of the selected area is made.

It is further noted that the method also resembles the method known as nanobeam STEM, in which a small cross-over is scanned over the sample. Here the opening half-angle is optimized for minimal diameter of the cross-over, as explained before. The method according to the invention differs from nanobeam STEM in that the opening half-angle is optimised to overall beam diameter instead of only the cross-over diameter.

In an embodiment of the method according to the invention the sample is substantially perpendicular to the finely focused beam and the length L of the sample material through which the transmitted particles have to travel equals the thickness T of the sample, and the opening half-angle α of the finely focused beam is set to a value α such that $0.5 \cdot R(\alpha)/T \leq \tan(\alpha) \leq 2 \cdot R(\alpha)/T$.

When the sample is perpendicular to the beam, also known as the non-tilted position, the length L equals the thickness of the sample.

It is noted that the angle under which the beam impinges on the sample is virtually unchanged during scanning. The beam is scanned over the sample by deflecting the beam by a deflection unit, the deflection unit normally deflecting the beam with an electric or magnetic field. The area over which the beam is scanned is much smaller than the distance between the scan unit and the sample, so that the angle under which the beam impinges is virtually independent on the deflection of the beam.

In another embodiment of the method according to the invention the sample is tilted to an angle β with respect to the finely focused beam before the image is acquired, as a result of which the length L of the sample material through which the transmitted particles have to travel equals the thickness T of the sample multiplied by the cosine of the tilt angle β, and the opening half-angle α of the finely focused beam is set to a value α such that $0.5 \cdot R(\alpha) \cdot \cos(\beta)/T \leq \tan(\alpha) \leq 2 \cdot R(\alpha) \cdot \cos(\beta)/T$.

When the sample is tilted, the beam impinges on the sample under an angle. The particles transmitted through the sample have to travel though a larger amount of material.

In yet another embodiment of the method according to the invention the method further comprises determining a maximum tilt angle $\beta_{max}$ and a number of images to be acquired, determining the maximum length $L_{max}$ of the sample material through which the transmitted particles have to travel, $L_{max}=T/\cos(\beta_{max})$, setting the opening half-angle α of the finely focused beam to a value α such that $0.5 \cdot R(\alpha) \cdot \cos(\beta_{max})/T \leq \tan(\alpha) \leq 2 \cdot R(\alpha) \cdot \cos(\beta_{max})/T$, acquiring a series of images at different tilt angles, each of the different tilt angles being equal to or less than the maximum tilt angle $\beta_{max}$, and combining said series of images in a 3D reconstruction of the bulk information of the sample.

In STEM tomography a series of images is acquired under different tilt angles, e.g. under a tilt ranging from −70 degrees to +70 degrees with increments of 2 degrees. As a result the maximum length of material through which the particles have to travel occurs for the most tilted positions.

In still another embodiment of the method according to the invention the sample shows two substantially flat surfaces and the cross-over is located between said surfaces.

This describes that the cross-over is imaged between the surfaces of the sample, i.e. in the sample.

In a further embodiment of the method according to the invention the cross-over is located substantially halfway the two surfaces.

In another embodiment of the method according to the invention the focal length of the lens focusing the finely focused beam is changed during the scanning of the beam over the sample so as to compensate for the tilting of the sample relative to the finely focused beam, thereby keeping the distance of the cross-over with respect to a surface of the sample substantially constant.

In this embodiment the distance of the cross-over to the surface of the sample is kept constant while scanning the beam over the sample. This is also known as "dynamic focus".

In yet another embodiment of the method according to the invention the thickness of the sample is larger than 100 nm.

Especially for thick sample the invention offers an improved resolution. As mentioned before, conventional STEM uses an opening half-angle of e.g. 10 mrad, for a 100 nm thick sample resulting in a diameter of the beam of 0.5 nm when the cross-over is positioned halfway the sample surfaces. For a thickness of 100 nm and more a much improved resolution can be achieved using the method according to the invention.

In a further embodiment of the method according to the invention the thickness of the sample is larger than 1000 nm.

In yet another embodiment of the method according to the invention the apparatus is a scanning transmission electron microscope.

STEM is a well known technique that can benefit from the invention, although the invention is also applicable to other techniques using e.g. hydrogen particles, ions, etc.

In still another embodiment of the method according to the invention the sample is an amorphous sample.

The invention is especially beneficial to samples comprising features such as catalysts, macro-molecules or structures in biological tissue in samples embedded in an amorphous matrix.

In an aspect of the invention software for programming a programmable controller of a particle-optical apparatus, the apparatus equipped to scan a finely focused beam of particles over a sample and to detect particles transmitted through the sample, the controller equipped to control the opening half-angle of the finely focused beam and the focal plane of the finely focused beam is characterized in that the software comprises code for programming the controller to adjust the opening half-angle α of the finely focused beam as a function of a variable representing the thickness T of the sample.

In an embodiment of the software according to the invention the software further comprises code for programming the controller to obtain the variable representing the thickness T of the sample via a user interface of the particle-optical apparatus.

In another embodiment of the software according to the invention the software further comprises code for programming the controller to adjust the opening half-angle α of the finely focused beam as a function of a variable representing the tilt of the sample with respect to the finely focused beam.

In a further embodiment of the software according to the invention the software further comprises code for programming the controller to adjust the focal plane of the finely focused beam as a function of the variable representing the tilt of the sample with respect to the finely focused beam, resulting in a focal plane that is tilted with respect to the finely focused beam.

The invention is now elucidated with the help of figures, where identical numerals refer to identical features.

Figure 2:
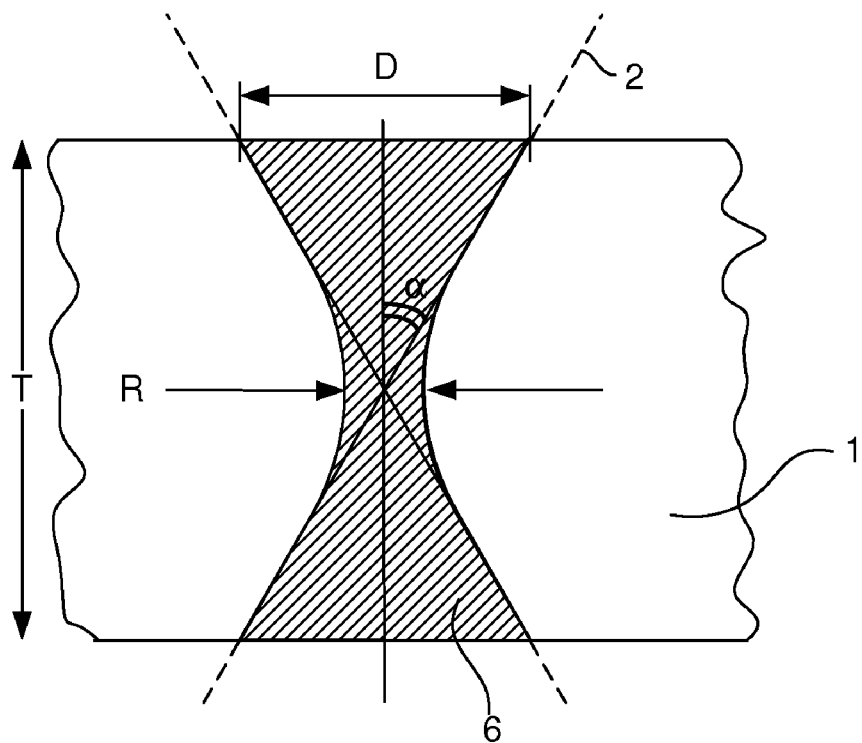
Figure 3:
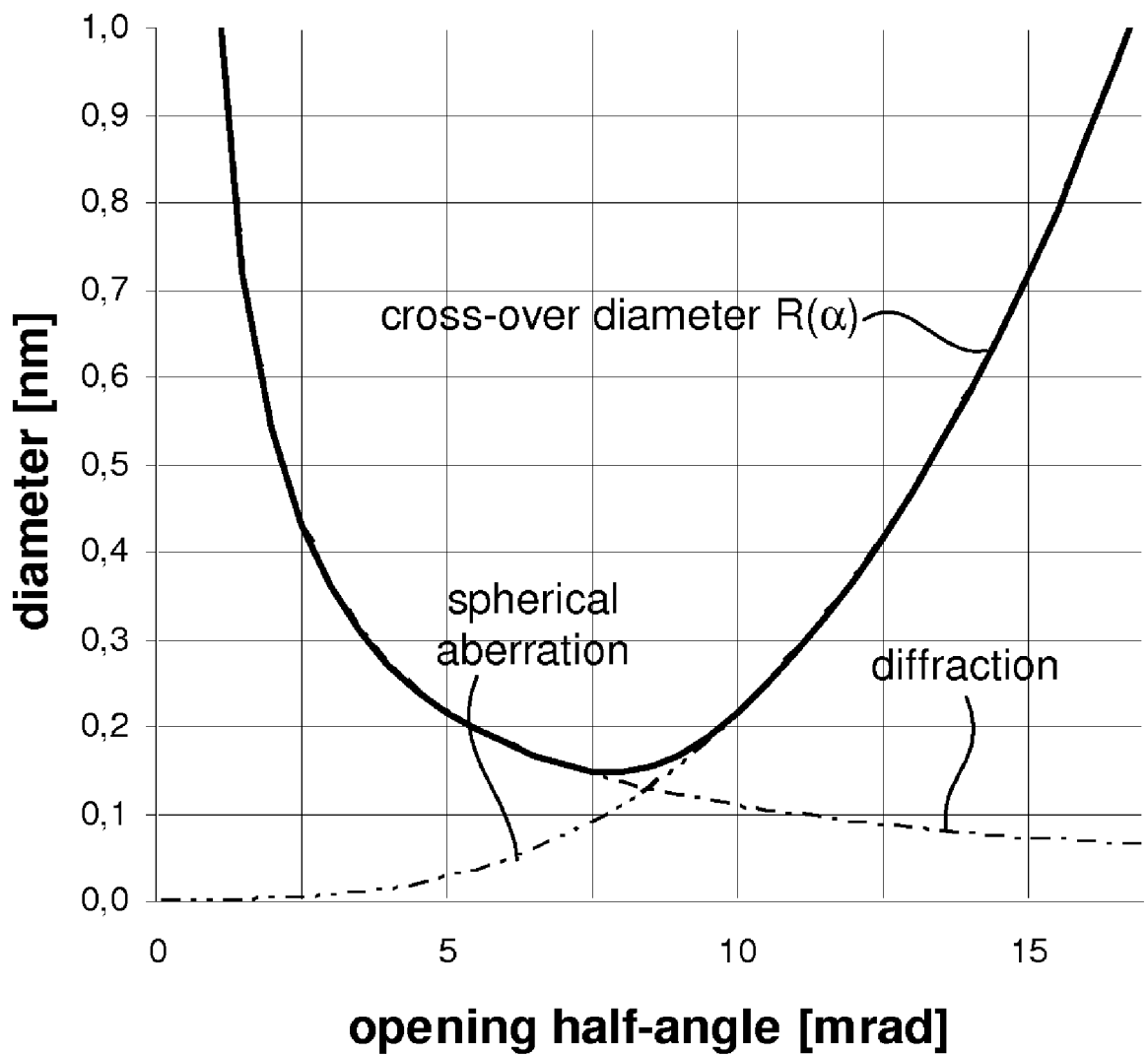
Figure 4:
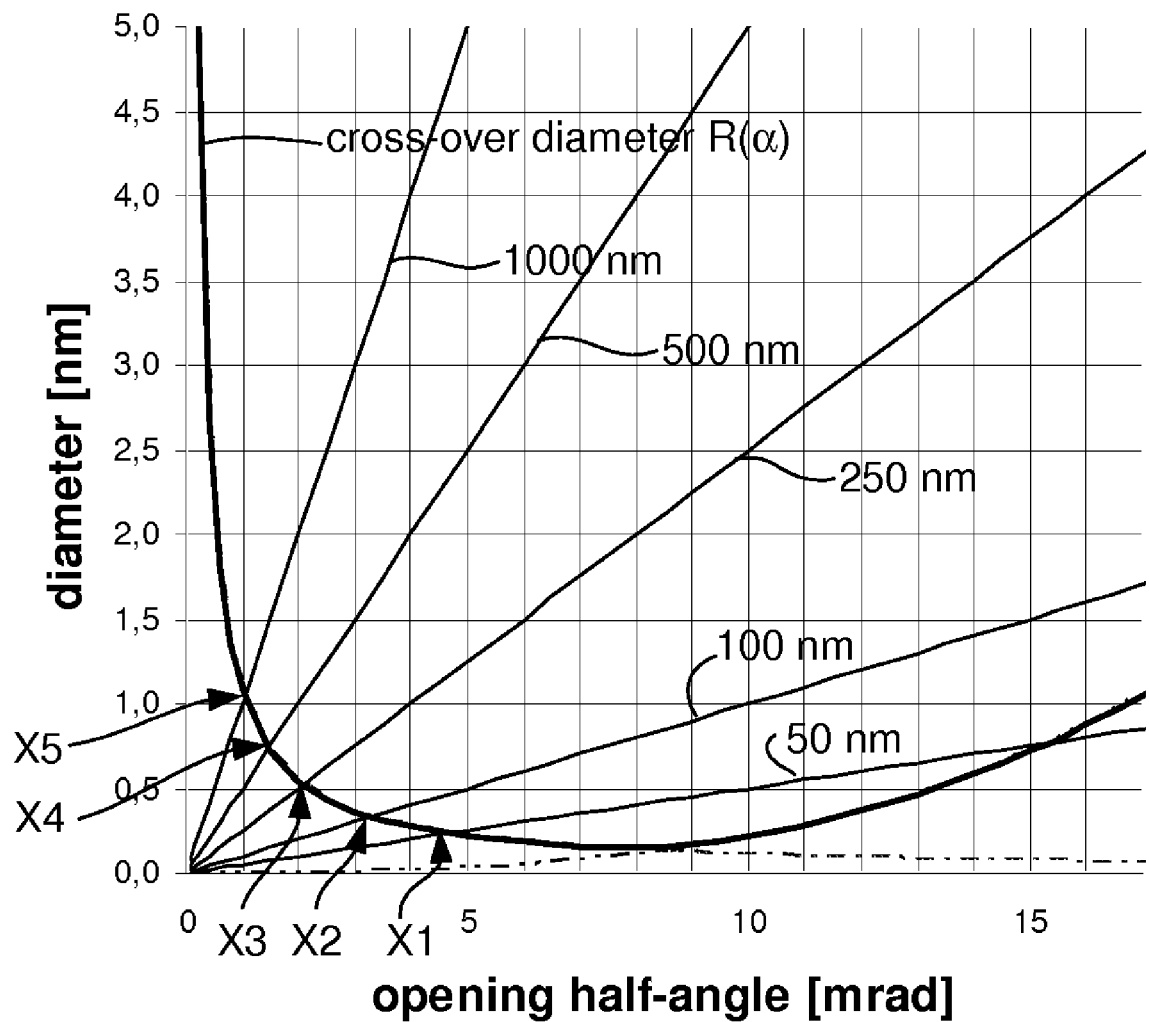
Figure 5:
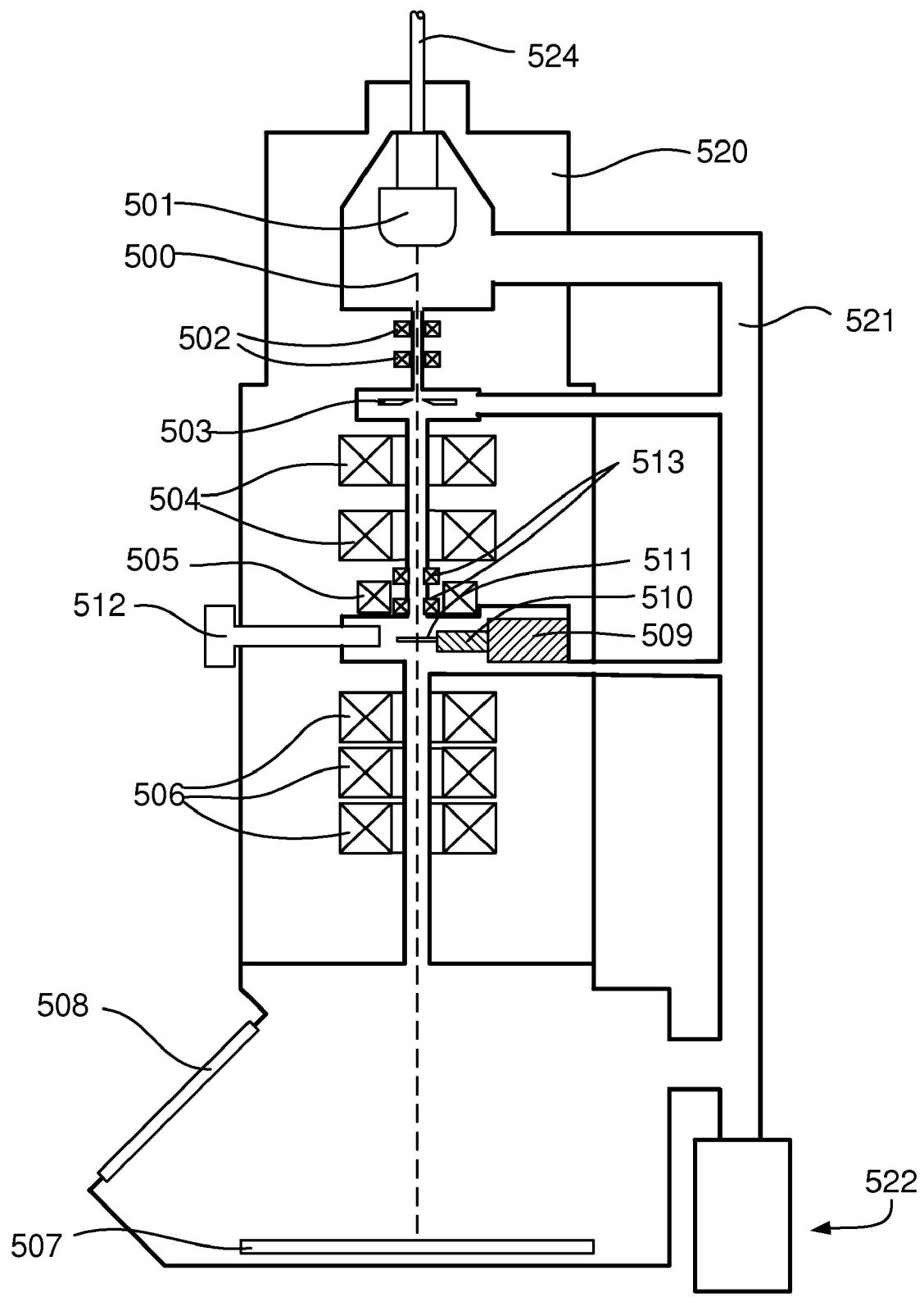

To that end:

FIG. 1 schematically shows a beam impinging on a sample,

FIG. 2 schematically shows a detail from FIG. 1,

FIG. 3 shows a schematic curve of resolution as a function of opening half-angle, FIG. 4 shows a schematic curve showing resolution R(α) and diameter D for different sample thicknesses versus opening half-angle, and FIG. 5 schematically shows a STEM.

FIG. 1 schematically shows a beam impinging on a sample. A sample 1 is illuminated with a focused beam 2. The focused beam forms a cross-over 3 in the sample. Part of the electrons forming the beam 1 are transmitted through the sample and exit the sample. The electrons transmitted through the sample are both unscattered electrons 4, which are not deflected, and scattered electrons 5A, 5B and 5C, which are scattered due to interaction with atoms of the sample. An enlarged view of area A is shown in FIG. 2

FIG. 2 schematically shows a detail of FIG. 1. It shows an enlarged view of area A of FIG. 1. The scattered electrons 5A, 5B and 5C shown in FIG. 1 are omitted for clarity, although such electrons are still generated. The impinging beam 2 irradiates the volume 6 of the sample 1. The beam has a cross-over with a diameter R, said diameter being a function of the opening half-angle α of beam 1.

Disregarding the contribution of aberrations, the beam has at the surface of the sample a diameter D due to the opening half-angle α. This diameter D is a function of the opening half-angle α, and the thickness T of the sample. In the optimum situation, where the cross-over is in the middle of the sample, D=T tan(α).

As mentioned before, the optimum cross-over diameter obtainable with commercial microscopes is nowadays approximately 0.1 nm. This is achieved with an opening half-angle α of between 5 and 15 mrad, and very thin samples. Using a sample with a thickness T of e.g. 1 μm, and an opening half-angle of 10 mrad, the diameter D would be approximately 10 nm. This shows that such extreme resolution can only be achieved for extremely thin samples.

It is noted that when using a beam in which part of the beam has a small diameter and a part of the beam has a large diameter, a high resolution can be achieved for those parts of the sample at the cross-over plane. However, from other parts of the sample (removed from the cross-over plane) only blurred information can be derived.

FIG. 3 shows a schematic curve of resolution as a function of opening half-angle. The curve is representative for a 300 kV microscope having a spherical aberration of 1.2 mm and negligible chromatic aberration and negligible source size. Therefore only spherical aberration and diffraction contribute to the diameter of the cross-over. For this instrument the optimum cross-over diameter R(α) is approximately 0.15 nm at an opening half-angle α of 8 mrad.

It is noted that several methods may be used to add the different contributions. Here the method described in "Addition of different contributions to the charged-particle beam size", J. E. Barth et al, Optik 1996 (101), pages 101-109 is used.

It is remarked that here the diameter of the spherical aberration and the diameter of the diffraction are used to add up to the diameter of the cross-over R(α).

FIG. 4 shows a schematic curve showing resolution R(α) and diameter D for different sample thicknesses versus opening half-angle. In this figure the same curve for the diameter of the cross-over R(α) is shown. Also shown are curves for different sample thicknesses T representing the diameter D at the surface of the sample resulting from the opening angle used. As can be seen clearly, at an opening angle of 8 mrad, corresponding with the optimum cross-over diameter, the diameter D for a 100 nm thick sample is 0.8 nm, much larger than the diameter of the cross-over. For a sample with a thickness of 250 nm the diameter of the cross-over is 2 nm, and for a 500 nm thick sample even 4 nm.

At positions X1 . . . X5 the cross-over diameter R(α) is approximately equal to the diameter D, and therefore a balance between the contributions due to cross-over diameter and convergence angle occurs at the corresponding opening half-angles. For a 100 nm thick sample the maximum diameter of the beam is now approximately 0.4 nm, a factor two lower than when using the opening half-angle giving the optimum cross-over diameter. For a sample with a thickness of e.g. 500 nm the maximum diameter is now only approximately 0.8 nm instead of 4 nm, an improvement of approximately 5 times when compared to the maximum beam diameter at 8 mrad, although 5 times worse than the cross-over diameter of 0.15 nm at 8 mrad, i.e. the resolution that can be achieved for very thin samples.

It is noted that the optimum opening half-angle can be computed, but that a look-up table can be used as well to determine the optimum opening half-angle.

It is further noted that, although the curve for the cross-over diameter and the curves for the thicknesses may show two intersections, the minimum diameter always occurs for an opening half-angle equal to or less than the opening half-angle resulting in optimum cross-over diameter.

FIG. 5 schematically shows a STEM.

In FIG. 5 a particle source 501 produces a beam of electrons travelling round particle-optical axis 500. The particle source is fed via high voltage wire 524 to electronics (not shown), the electronics delivering appropriate voltage and current for the operation of the particle source. The beam of electrons is centred round particle-optical axis by e.g. particle-optical deflectors 502. Diaphragm 503 shows an aperture acting as a beam limiting aperture. Particle-optical lenses 502 act as a condenser for delivering the beam of electrons to the objective lens 505. A sample mounted on sample holder 511 is illuminated by the particle beam, and a fraction of the electrons pass through the specimen. These electrons are imaged by particle-optical lenses 506 onto a detector 507. Detector 507 can be e.g. a fluorescent screen or a CCD camera. When a fluorescent screen is used, the image may be viewed through glass window 508.

The beam is scanned over the surface of the sample by particle-optical deflector 510.

The interior of the microscope is enveloped by a vacuum wall 520, and evacuated by vacuum pump 522 via vacuum connections 521.

For positioning the specimen holder a manipulator 509 is used. An airlock 512 enables the introduction of a specimen mounted on a specimen holder into the evacuated interior of the TEM and the mounting of the specimen holder onto the sub-stage.

The opening angle of the beam impinging on the sample is set by the focal length of the objective lens 505 (which for a given instrument is a largely fixed value), the magnification of the condenser lenses 504 and the size of the aperture in diaphragm 503.

It is noted that, as known to the person skilled in the art, many models of STEMs are known, with different number of lenses, deflectors, different manipulators, detectors, etc.

We claim as follows:

1. Method for obtaining a transmission image of a sample in a particle-optical apparatus, said apparatus equipped to image a sample by scanning the sample with a finely focused beam of particles and detecting particles transmitted through the sample, said finely focused beam showing a smallest diameter, the so-named cross-over, the diameter of the cross-over R being a function of the opening half-angle α which is adjusted to a value as a function of a variable representing the thickness T of the sample, the method comprising:

acquiring an image of the sample by scanning the sample with the finely focused beam of particles and detecting particles transmitted through the sample, characterized in that, before the image is acquired, the thickness T of the sample is determined or estimated, the length L of the sample material through which the transmitted particles have to travel is derived from the thickness T of the sample, and the opening half-angle α is set to a value such that $0.5 \cdot R(\alpha)/L \leq \tan(\alpha) \leq 2 \cdot R(\alpha)/L$, as a result of which the sample is scanned with a beam having a substantially constant diameter over a length equal to the length L of the sample material through which the transmitted particles have to travel.

2. The method according to claim 1 in which the sample is substantially perpendicular to the finely focused beam and the length L of the sample material through which the transmitted particles have to travel substantially equals the thickness T of the sample, and the opening half-angle α of the finely focused beam is set to a value α such that $0.5 \cdot R(\alpha)/T \leq \tan(\alpha) \leq 2 \cdot R(\alpha)/T$.

3. The method according to claim 1 in which a line normal to the surface to the sample is tilted over an angle β with respect to the finely focused beam before the image is acquired, as a result of which the length L of the sample material through which the transmitted particles have to travel equals the thickness T of the sample multiplied by the cosine of the tilt angle β, and the opening half-angle α of the finely focused beam is set to a value α such that $0.5 \cdot R(\alpha) \cdot \cos(\beta)/T \leq \tan(\alpha) \leq 2 \cdot R(\alpha) \cdot \cos(\beta)/T$.

4. The method according to claim 3 in which the focal length of the lens focusing the finely focused beam is changed during the scanning of the finely focused beam over the sample so as to compensate for the tilting of the sample relative to the beam, thereby keeping the distance of the cross-over with respect to a surface of the sample substantially constant.

5. The method according to claim 1 further comprising forming a 3D reconstruction by:
   determining a maximum tilt angle $\beta_{max}$ and a number of images to be acquired,
   determining the maximum length $L_{max}$ of the sample material through which the transmitted particles have to travel, $L_{max} = T/\cos(\beta_{max})$
   setting the opening half-angle α of the finely focused beam to a value α such that $0.5 \cdot R(\alpha) \cdot \cos(\beta_{max})/T \leq \tan(\alpha) \leq R(\alpha) \cdot \cos(\beta_{max})/T$,
   acquiring a series of images at different tilt angles, each of the different tilt angles being equal to or less than the maximum tilt angle $\beta_{max}$, and
   combining said series of images in a 3D reconstruction of the bulk information of the sample.

6. The method according to claim 1 in which the sample shows two substantially flat surfaces and the cross-over is located between said surfaces.

7. The method according to claim 6 in which the cross-over is located substantially halfway the two surfaces.

8. The method according to claim 7 in which the focal length of the lens focusing the finely focused beam is changed during the scanning of the finely focused beam over the sample so as to compensate for the tilting of the sample relative to the beam, thereby keeping the distance of the cross-over with respect to a surface of the sample substantially constant.

9. The method according to claim 1 in which the thickness T of the sample is larger than 100 nm.

10. The method according to claim 9 in which the thickness T of the sample is larger than 1000 nm.

11. The method according to claim 1 in which the particle-optical apparatus is a scanning transmission electron microscope.

12. The method according to claim 1 in which the sample is an amorphous sample.

13. Software for programming a programmable controller of a particle-optical apparatus, the apparatus equipped to scan a finely focused beam of particles over a sample and to detect particles transmitted through the sample, the controller equipped to control the opening half-angle α of the finely focused beam and the focal plane of the finely focused beam, characterized in that the software comprises code for programming the controller to adjust the opening half-angle α of the finely focused beam as a function of a variable representing the thickness T of the sample.

14. The software according to claim 13 in which the software further comprises code for programming the controller to obtain the variable representing the thickness T of the sample via a user interface of the particle-optical apparatus.

15. The software according to claim 14 in which the software further comprises code for programming the controller to adjust the opening half-angle α of the finely focused beam as a function of a variable representing the tilt β of the sample with respect to the finely focused beam.

16. The software according to claim 13 in which the software further comprises code for programming the controller to adjust the opening half-angle α of the finely focused beam as a function of a variable representing the tilt β of the sample with respect to the finely focused beam.

17. The software according to claim 16 in which the software further comprises code for programming the controller to adjust the focal plane of the finely focused beam as a function of the variable representing the tilt β of the sample with respect to the finely focused beam, resulting in a focal plane that is tilted with respect to the finely focused beam.

18. Method for obtaining a transmission image of a sample in a particle-optical apparatus, the apparatus equipped to image a sample by scanning the sample with a finely focused beam of particles and detecting particles transmitted through the sample, the finely focused beam having a cross-over diameter R being a function of the opening half-angle α which is adjusted to a value as a function of a variable representing the thickness T of the sample, the method comprising:
   determining the thickness T of the sample;
   deriving from the thickness T and the length L of the sample material through which the transmitted particles have to travel;
   setting the opening half-angle α to a value such that $0.5 \cdot R(\alpha)/L \leq \tan(\alpha) \leq 2 \cdot R(\alpha)/L$;
   scanning the sample with the finely focused beam of particles, said beam having a substantially constant diameter over a length equal to the length L of the sample material through which the transmitted particles have to travel; and
   acquiring an image of the sample by detecting particles transmitted through the sample.

* * * * *